(12) United States Patent
Zhang et al.

(10) Patent No.: US 12,279,386 B2
(45) Date of Patent: Apr. 15, 2025

(54) ELECTRONIC DEVICE

(71) Applicant: VEONEER SWEDEN AB, Vargarda (SE)

(72) Inventors: Allen Zhang, Shaghai (CN); Jerry Chai, Shaghai (CN); Len Liu, Shaghai (CN)

(73) Assignee: Magna Electronics Sweden AB, Vårgårda (SE)

( * ) Notice: Subject to any disclaimer, the term of this patent is extended or adjusted under 35 U.S.C. 154(b) by 92 days.

(21) Appl. No.: 18/004,176

(22) PCT Filed: Jun. 23, 2021

(86) PCT No.: PCT/CN2021/101920
§ 371 (c)(1),
(2) Date: Jan. 3, 2023

(87) PCT Pub. No.: WO2022/001800
PCT Pub. Date: Jan. 6, 2022

(65) Prior Publication Data
US 2023/0276586 A1 Aug. 31, 2023

(30) Foreign Application Priority Data

Jul. 3, 2020 (CN) .......................... 202010635358.7

(51) Int. Cl.
*H05K 5/02* (2006.01)
*H05K 5/10* (2025.01)
*H05K 9/00* (2006.01)

(52) U.S. Cl.
CPC ............. *H05K 5/0221* (2013.01); *H05K 5/10* (2025.01); *H05K 9/0007* (2013.01)

(58) Field of Classification Search
CPC ... H05K 5/0221; H05K 5/0004; H05K 9/0007
See application file for complete search history.

(56) References Cited

U.S. PATENT DOCUMENTS 8,830,679 B2 * 9/2014 Scholeno ............. H05K 7/2049
174/16.3
8,942,001 B2 1/2015 Kawai et al.
(Continued)

FOREIGN PATENT DOCUMENTS

CN 201398276 Y 2/2010
CN 209085812 U 7/2019
(Continued)

OTHER PUBLICATIONS

English translation DE 102019209426 (Year: 2020).*
(Continued)

*Primary Examiner* — Mukundbhai G Patel
(74) *Attorney, Agent, or Firm* — DICKINSON WRIGHT PLLC

(57) ABSTRACT

An electronic device, having a housing and a sealing cover. Electronic components of the electronic device are provided in the housing, and the sealing cover can close the housing. The housing is provided with a first fitting member, and the sealing cover is provided with a second fitting member and a third fitting member. In an unlocked state, the first fitting member can be connected to the second fitting member or the third fitting member by respective locking portions thereof. In a locked state, the first fitting member can be connected to the second fitting member and the third fitting member by the locking portions.

15 Claims, 3 Drawing Sheets

(56) References Cited

U.S. PATENT DOCUMENTS

| | | | | |
|---|---|---|---|---|
| 8,968,030 | B2* | 3/2015 | Zhang | H04M 1/026 |
| | | | | 439/630 |
| 9,247,656 | B2 | 1/2016 | Fairchild | |
| 10,411,408 | B2* | 9/2019 | Wu | H01R 13/6272 |
| 10,602,629 | B2 | 3/2020 | Robl et al. | |
| 2013/0070432 | A1 | 3/2013 | Kawai et al. | |
| 2014/0038445 | A1 | 2/2014 | Zhang et al. | |
| 2015/0061475 | A1 | 3/2015 | Fairchild | |
| 2019/0254188 | A1* | 8/2019 | Cmich | H02G 3/086 |
| 2019/0350097 | A1 | 11/2019 | Robl et al. | |

FOREIGN PATENT DOCUMENTS

| | | | |
|---|---|---|---|
| CN | 110475443 A | | 11/2019 |
| CN | 209824320 U | | 12/2019 |
| CN | 209914404 U | | 1/2020 |
| CN | 110799026 A | | 2/2020 |
| DE | 102019209426 A1 | * | 12/2020 |
| JP | H09275291 A | | 10/1997 |
| KR | 102042145 B1 | | 11/2019 |

OTHER PUBLICATIONS

International Search Report of PCT/CN2021/101920 mailed Sep. 22, 2021.
European Search Report of EP 21 83 2353, mailed Jul. 10, 2024.
Office Action regarding corresponding CN App. No. 202010635358. 7; dated Dec. 13, 2024.

* cited by examiner

ELECTRONIC DEVICE

CROSS-REFERENCE TO RELATED APPLICATIONS

The present application is a 35 U.S.C. § 371 national phase of PCT International Application No. PCT/CN2021/101920, filed Jun. 23, 2021, which claims the benefit of priority under 35 U.S.C. § 119 to Chinese Patent Application No. 202010635358.7, filed Jul. 3, 2020, entitled "ELECTRONIC DEVICE", the entire content of which is incorporated herein by reference.

TECHNICAL FIELD

The present invention relates to an electronic device including a housing and a sealing cover, wherein the electronic device is provided in the housing, and the sealing cover can close the housing.

BACKGROUND

The EMI standard is a limitation standard for external emission or transmission of electromagnetic energy when an electronic device is forced to operate, which are formulated by some international organizations such as the Radio Interference Association and the like. In designing products related to an electronic device, it is necessary to meet the EMI standard to shield electromagnetic interference. For an electronic device, it is generally required to have a shield (e.g., a housing) to surround the interference sources of components, circuits, assemblies, cables or the entire system. Since the shield plays the role of energy absorption (eddy current loss), energy reflection (interface reflection of electromagnetic waves on the shield) and energy offset (a reverse electromagnetic field generated on the shield by electromagnetic induction may counteract a part of interfering electromagnetic waves) for external interference electromagnetic waves and internal electromagnetic waves from conductors, cables, components, circuits, or the system or the like, the shield has the function of attenuating the interference.

In the prior art, shields of many electronic devices respectively consist of a housing and a sealing cover. The sealing cover is fixedly connected to the housing of the electronic device by means of screws. For example, a technical solution in a patent document No. KR102042145 B1 relates to a temperature electronic device in which a sealing cover is fixedly connected to a housing of the electronic device by means of screws; and a patent document No. CN209085812U relates to a fiber unidirectional strain electronic device for stress monitoring, in which a sealing cover is also hermetically connected to a housing by means of screws. Problems with such a design are that it is not easy to open the sealing cover when a maintenance operation is required on the electronic device, and both the assembly cost and the component cost are high, failing to meet the requirements of fully automated modern assembly processes.

SUMMARY OF EXEMPLARY EMBODIMENTS OF THE INVENTION

Accordingly, to solve the above-mentioned technical problems in the prior art, the present invention provides an electronic device which may guarantee the effect of electromagnetic protection and facilitate assembly and disassembly. The electronic device comprises a housing and a sealing cover, wherein electronic components of the electronic device are provided in the housing, and the sealing cover can close the housing. According to a design solution of the present invention, the housing is provided with a first fitting member, and the sealing cover is provided with a second fitting member and a third fitting member; in an unlocked state, the first fitting member can be connected to the second fitting member or the third fitting member by respective locking portions thereof; and in a locked state, the first fitting member can be connected to the second fitting member and the third fitting member by the locking portions. According to the present invention, screw connection in the prior art is replaced with locking-fit connection. Compared with the screw connection, the locking-fit connection is simple in assembly process, and the first fitting member is easily separated from the second fitting member and the third fitting member, so as to facilitate the handling of electronic components located inside.

According to a preferred implementation of the present invention, in the locked state, an elastic force directed away from the first fitting member is present in the second fitting member and the third fitting member. In the locked state, the second and third fitting members of the sealing cover tightly abut the first fitting member of the housing and are subjected to the elastic force of the first fitting member, thereby reducing a gap between the second and third fitting members and the first fitting member.

According to a preferred implementation of the present invention, the locking portion of the first fitting member is designed as a protruding structure, the locking portions of the second and third fitting members are each designed as an engagement structure extending towards the first fitting member, and an engagement opening is provided on the engagement structure. When the sealing cover is connected to the housing, the protruding structure can be inserted into the engagement opening, such that the protruding structure and the engagement structure form a snap-fit connection, so as to connect the first fitting member to the second fitting member and/or the third fitting member. Preferably, a pair of protruding structures and a pair of engagement structures are respectively provided on respective two sides of the sealing cover and the housing, and certainly, more protruding structures and engagement structures may also be provided. Further preferably, a bending portion is provided at a front end of the engagement structure, and mainly has two functions: one is to allow the front end of the engagement structure to move across the protruding structure more easily so as to enable the protruding structure to be inserted into the engagement opening when the engagement structure is guided to the protruding structure; and the other one is to allow the engagement structure to be manually pulled away from the protruding structure more easily when the engagement structure is to be separated from the protruding structure. Correspondingly, a guide bevel may also be provided on one side of the protruding structure facing the sealing cover, such that the engagement structure is moved across the protruding structure more easily when the engagement structure is guided to the protruding structure, so as to enable the protruding structure to be inserted into the engagement opening. Further preferably, a curved portion is provided at a junction of the engagement structure and the sealing cover to prevent mismatching of the edge portions due to manufacturing tolerance when the sealing cover is connected to the housing. Further preferably, in order to enable the engagement structure to be fitted with the protruding structure more precisely, a guide groove for guiding movement of the engagement structure is provided on the housing.

According to a preferred implementation of the present invention, a folding line is provided on the sealing cover, and the folding line can reduce the size and length of a gap between the sealing cover and the housing to meet the EMI standard. The folding line enables the sealing cover to be shown as a fold line that is bent towards the housing in a top view, thereby reducing the gap between the sealing cover and the housing. Furthermore, the folding line can also increase pressing force of the engagement structure against the housing, so that the folding line enables the sealing cover to have a curved shape, and the curved feature provides holding force for securing the sealing cover to the housing. Preferably, the folding line is provided at the center of the sealing cover, an extension direction of the folding line being perpendicular to a movement direction of the sealing cover. Further preferably, the folding line is made by punching. Both the sealing cover and the housing are preferably made of metal, the sealing cover is preferably made by punching, and the folding line may be formed by punching while the sealing cover is punched, thereby simplifying the manufacturing process and reducing the cost.

According to a preferred implementation of the present invention, a notch for placing an electric wire cable is provided at one end of the housing facing the sealing cover, so that the electric wire cable of the electronic device provided inside the housing may be led out of the electronic device. Further preferably, a guide rail is provided on a path of the sealing cover moving toward the housing, so as to allow the sealing cover to be connected to the housing more easily (especially in the case of automated assembly).

In the foregoing detailed description of at least one implementation, it should be understood that there are still numerous variations in accordance with the present invention. Similarly, it should also be understood that the at least one implementation is merely used as an example, but is in no way intended to limit the scope of protection, application field, or structural design of the present invention. More specifically, the implementations merely provide corresponding technical inspirations for those skilled in the art, and on this basis, different arrangements and arbitrary combinations of the functions or components of the above-described implementations also fall within the scope of protection of the present invention.

DETAILED DESCRIPTION

Figure 1:
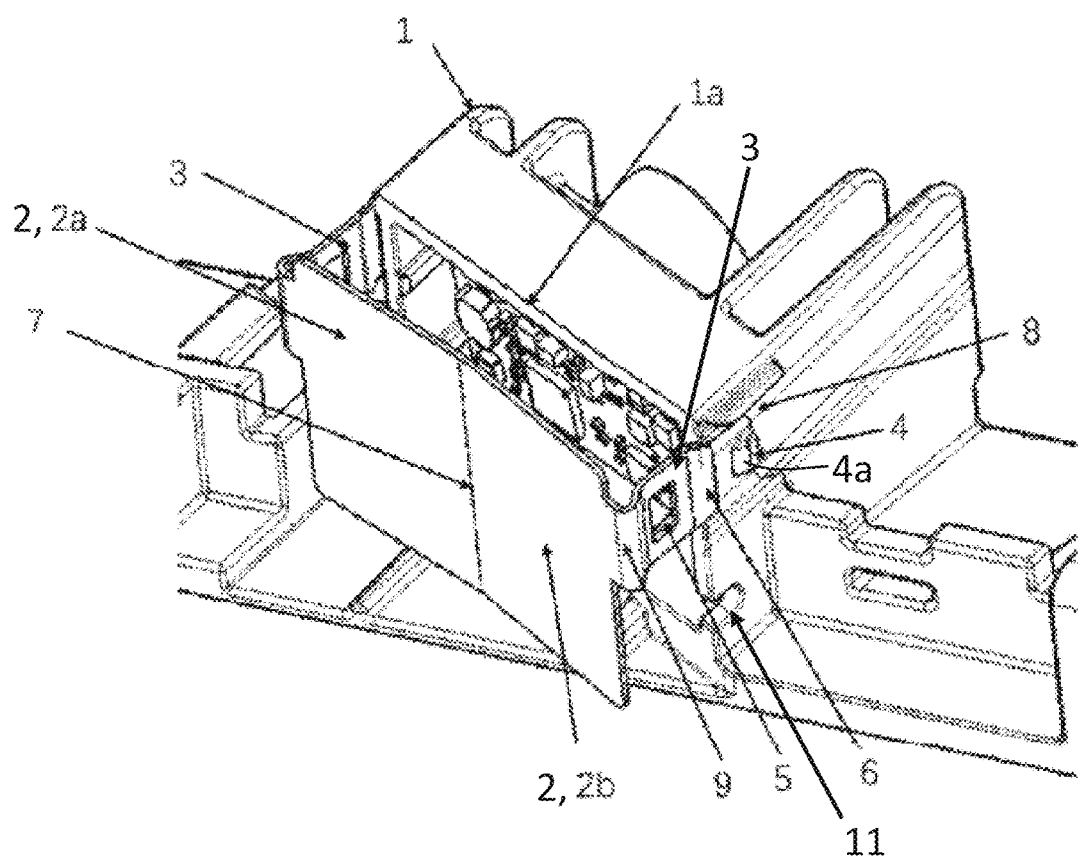
FIG. 1 shows a perspective view of a preferred implementation of an electronic device according to the present invention.

FIG. 1 shows a preferred implementation of an electronic device according to the present invention. The electronic device includes a housing 1 and a sealing cover 2. Electronic components of the electronic device are provided in the housing 1, and the sealing cover 2 can close the housing 1, so that the electronic components are in a closed environment. The sealing cover 2 is detachable, so that the electronic device can be assembled, disassembled and maintained conveniently.

As shown in FIG. 1, the housing 1 is provided with a first fitting member 1a, and a protruding structure 4 is provided on both sides of the first fitting member 1a. The sealing cover 2 is provided with a second fitting member 2a and a third fitting member 2b, and an engagement structure 3 is provided at corresponding positions of the second fitting member 2a and the third fitting member 2b respectively. An engagement opening 5 is provided at a corresponding position of the engagement structure 3 for mating connection with the protruding structure 4. When the sealing cover 2 is connected to the housing 1, the protruding structures 4 extend into the engagement openings 5 to achieve snap-fit connection between the sealing cover 2 and the housing 1. In a locked state, the first fitting member 1a can be connected to the second fitting member 2a and the third fitting member 2b by way of snap-fit connection; and in an unlocked state, the first fitting member 1a can be connected to only the second fitting member 2a or only the third fitting member 2b by way of snap-fit connection, or alternatively, the first fitting member 1a is not connected to either of the second fitting member and the third fitting member, thereby achieving a more flexible removal mode of the sealing cover.

In this embodiment, a guide groove 8 is provided at a corresponding position of the first fitting member 1a of the housing 1, so that the engagement structure 3 can be connected to the protruding structure 4 precisely in a particular direction by way of snap-fit connection. A bending portion 6 bent upwards is provided at the front end of the engagement structure 3, and the bending portion 6 mainly has two functions: one is to allow the engagement structure 3 to move across the protruding structure 4 more easily so as to enable the protruding structure 4 to be inserted into the engagement opening 5 when the engagement structure 3 is guided to the protruding structure 4, and the other one is to allow the engagement structure 3 to be manually pulled away from the protruding structure 4 more easily when the engagement structure 3 is to be separated from the protruding structure 4. Correspondingly, a guide bevel may also be provided on one side of the protruding structure 4 facing the engagement structure 3 to facilitate the fitting of the engagement structure 3 and the protruding structure 4. In this embodiment, only one protruding structure 4 is provided on each of two sides of the housing 1, and a corresponding engagement structure 3 is provided on each of two sides of the sealing cover 2. Further preferably, a plurality of paired engagement structures 3 and protruding structures 4 may also be provided according to the shape of the housing and actual needs, and for example, the engagement structures 3 and the protruding structures 4 are respectively provided at four corners of the sealing cover 2 and corresponding positions of the housing 1, thereby making the connection between the sealing cover 2 and the housing 1 firmer.

Figure 3:
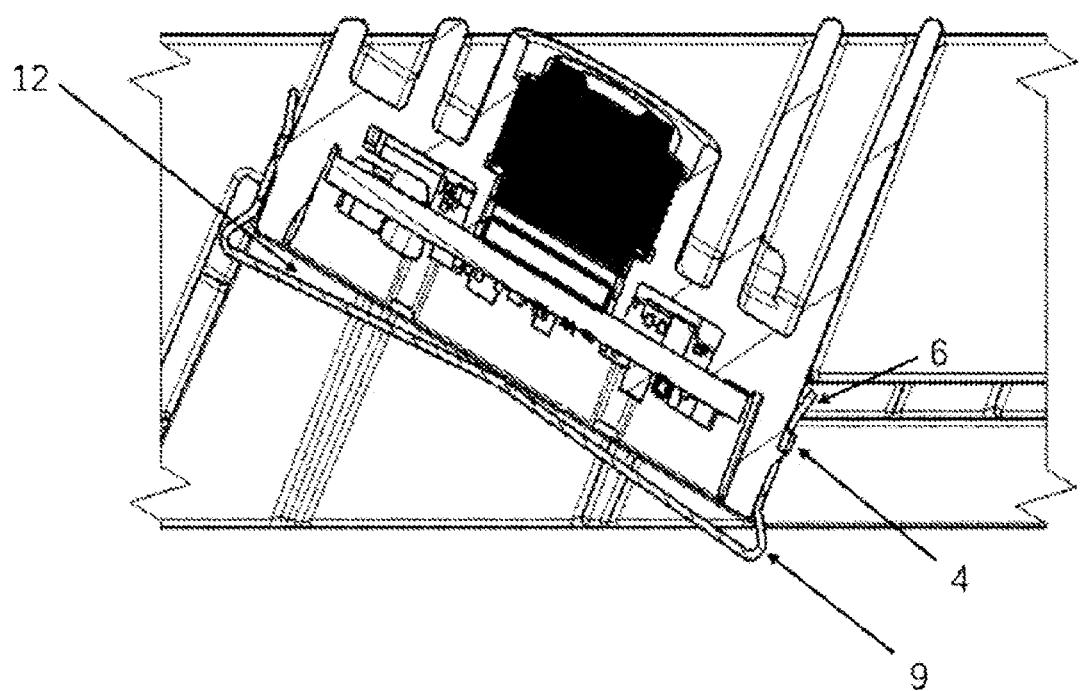
FIG. 3 shows a top view of the electronic device according to the present invention in a locked state.

After the sealing cover 2 and the housing 1 have been assembled, there is a gap 12 between the sealing cover 2 and the housing 1 due to manufacturing tolerance, as shown in FIG. 3. In order to meet EMI protection requirements, it is necessary to minimize the size and length of the gap. In this embodiment, a folding line 7 is provided in the middle of the sealing cover 2. As shown in FIG. 3, the folding line 7 enables the sealing cover 2 to be in the form of a fold line in a top view, thereby reducing the size and length of the gap between the sealing cover 2 and the housing 1.

Figure 2:
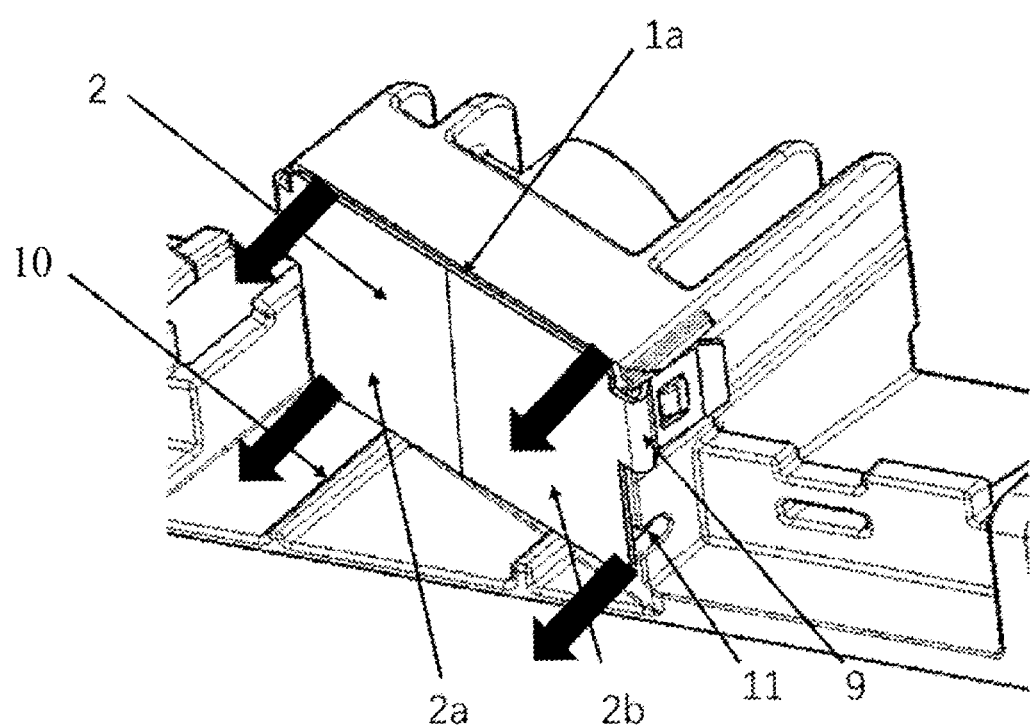
FIG. 2 shows a perspective view of the electronic device according to the present invention in a locked state.

FIG. 2 shows a perspective view of the sealing cover 2 and the housing 1 in a locked state. As shown in the figure, the protruding structure 4 is inserted into the engagement opening 5 to achieve snap-fit connection between the housing 1 and the sealing cover 2. A guide rail 10 is provided on a path of the sealing cover 2 moving toward the housing 1, so that the sealing cover 2 is precisely connected to the housing 1 along the guide rail 10, and especially in the case of automated assembly, the guide rail 10 can guide the sealing cover 2 to move to the housing 1 automatically. In the locked state, elastic force away from the first fitting member 1a as shown by the arrow direction in FIG. 2 is present in the second fitting member 2a and the third fitting member 2b of the sealing cover 2, so that the second fitting member 2a and the third fitting member 2b more tightly abut the first fitting member 1a, or alternatively, the second fitting member 2a and the third fitting member 2b are closer to the first fitting member 1a, thereby reducing the size and length of the gap between the sealing cover 2 and the housing 1.

According to the above-mentioned design solution of the present invention, the sealing cover may be connected to the housing by the following steps:

Step 1. moving the sealing cover 2 along the guide rail 10 until the folding line 7 is in contact with the housing 1;

Step 2. providing holding force for securing the sealing cover 2 to the housing 1 by the curved feature of the sealing cover 2; and Step 3. continuing to push the sealing cover 2 towards the housing 1 until the protruding structure 4 is inserted into the engagement opening 5 of the engagement structure 3.

It should be understood that although the foregoing descriptions and drawings illustratively describe some embodiments of the present invention, they are merely used as an example and not intended to limit the scope of protection of the present invention in any way. Various variations of the embodiments are also possible without departing from the scope of the claims and the scope associated therewith, particularly variations that are not mentioned in the claims and derived from the description of the embodiments and the accompanying drawings as well as the features. These features may also occur in a manner other than combinations specifically disclosed herein. A plurality of features of the present invention are mutually involved in the same sentences or in another context, but this does not prove that these features can only be present in particularly disclosed combinations; instead, single features may also be removed or replaced from the plurality of such features provided that the functionality of the present invention is not affected.

The invention claimed is:

1. An electronic device, comprising: a housing and a sealing cover, electronic components of the electronic device being provided in the housing, and the sealing cover being capable of closing the housing, wherein the housing includes a first fitting member having a generally flat shape defining an opening, and the sealing cover includes two engagement structures configured to selectively engage the housing, a second fitting member having a planar shape configured to selectively cover a portion of the opening, and a third fitting member having a planar shape configured to selectively cover another portion of the opening;

wherein the second fitting member and the third fitting member are angled relative to one another and separated by a folding line located between the two engagement structures for engaging the generally flat shape of the first fitting member when the sealing cover is in a locked state with both of the two engagement structures being secured to the housing.

2. The electronic device according to claim 1, in the locked state, elastic force directed away from the first fitting member is present in the second fitting member and the third fitting member.

3. The electronic device according to claim 1, wherein the first fitting member includes a locking portion having a protruding structure, and wherein each of the two engagement structures extends toward the housing, and an engagement opening is provided on at least one engagement structure of the two engagement structures, so that the protruding structure is adapted to be inserted into the engagement opening when the first fitting member is connected to the sealing cover.

4. The electronic device according to claim 3, further comprising a bending portion is provided at a front end of the engagement structure, opposite of the second fitting member and the third fitting member.

5. The electronic device according to claim 3, further comprising a guide bevel is provided on one side of the protruding structure facing the sealing cover.

6. The electronic device according to claim 3, further comprising a curved portion is provided at a junction of the engagement structure and the sealing cover.

7. The electronic device according to claim 3, further comprising a guide groove for guiding movement of the engagement structure is provided on the housing.

8. The electronic device according to claim 1, further comprising a folding line is provided on the sealing cover, and the folding line enables reducing a gap between the sealing cover and the housing.

9. The electronic device according to claim 8, further comprising the folding line is provided at the center of the sealing cover, an extension direction of the folding line being perpendicular to a movement direction of the sealing cover.

10. The electronic device according to claim 1, further comprising a notch for placing an electric wire cable is provided at one end of the housing facing the sealing cover.

11. The electronic device according to claim 1, further comprising a guide rail is provided on a path of the sealing cover moving toward the locked state on the housing.

12. The electronic device according to claim 1, wherein the two engagement structures each extend in a same direction and generally perpendicular to the second fitting member and the third fitting member.

13. The electronic device according to claim 1, wherein each engagement structure of the two engagement structures further defines an opening configured to receive a protruding structure of the housing in a latching arrangement.

14. The electronic device according to claim 1, wherein the folding line is located mid-way between the two engagement structures.

15. The electronic device according to claim 1, wherein the second fitting member and the third fitting member, together, define a rectangular shape having two opposite first edges and two second edges extending between the two opposite first edges and perpendicular thereto, wherein the two engagement structures are each disposed on a corresponding first edge of the two opposite first edges, and wherein the folding line extends between the two second edges.

* * * * *